United States Patent [19]

Nakamura et al.

[11] Patent Number: 5,322,526
[45] Date of Patent: Jun. 21, 1994

[54] METHOD FOR MANUFACTURING A SUPERCONDUCTING DEVICE HAVING AN EXTREMELY THIN SUPERCONDUCTING CHANNEL FORMED OF OXIDE SUPERCONDUCTOR MATERIAL

[75] Inventors: Takao Nakamura; Hiroshi Inada; Michitomo Iiyama, all of Osaka, Japan

[73] Assignee: Sumitomo Electric Industries, Ltd., Japan

[21] Appl. No.: 53,401

[22] Filed: Apr. 28, 1993

Related U.S. Application Data

[62] Division of Ser. No. 771,986, Oct. 8, 1991, Pat. No. 5,236,896.

[30] Foreign Application Priority Data

Oct. 8, 1990 [JP] Japan ................................ 270070
Oct. 25, 1990 [JP] Japan ................................ 287830

[51] Int. Cl.$^5$ .............................................. H01L 39/12
[52] U.S. Cl. ......................................... 29/25.02; 437/62; 437/190; 505/703
[58] Field of Search ................... 29/25.02; 437/40, 62, 437/190; 505/701, 703, 725, 739, 740

[56] References Cited

U.S. PATENT DOCUMENTS

| | | | |
|---|---|---|---|
| 5,126,315 | 6/1992 | Nishino et al. | 505/703 |
| 5,135,908 | 8/1992 | Yang et al. | 437/62 |
| 5,183,800 | 2/1993 | Nakagawa | 437/190 |
| 5,202,273 | 4/1993 | Nakamura | 437/40 |
| 5,212,150 | 5/1993 | Yamazaki | 505/703 |

Primary Examiner—Brian E. Hearn
Assistant Examiner—Chandra Chaudhari
Attorney, Agent, or Firm—Beveridge, DeGrandi, Weilacher & Young

[57] ABSTRACT

A superconducting device includes a superconducting channel constituted of an oxide superconductor thin film formed on a substrate, a superconductor source electrode and a superconductor drain electrode formed at opposite ends of the superconducting channel, so that a superconducting current can flow through the superconducting channel between the source electrode and the drain electrode. A gain electrode is located through an insulating layer on the superconducting channel so as to control the superconducting current flowing through the superconducting channel. The oxide superconductor thin film of the superconducting channel is formed of a c-axis oriented oxide superconductor crystal, and the oxide superconductor thin film of the superconductor source electrode and the superconductor drain electrode are formed of an a-axis oriented oxide superconductor crystal. The superconducting channel is continuous with the superconductor source electrode and the superconductor drain electrode.

7 Claims, 4 Drawing Sheets

METHOD FOR MANUFACTURING A SUPERCONDUCTING DEVICE HAVING AN EXTREMELY THIN SUPERCONDUCTING CHANNEL FORMED OF OXIDE SUPERCONDUCTOR MATERIAL

This is a divisional of co-pending application Ser. No. 07/771,986 now U.S. Pat. No. 5,236,896 filed on Oct. 8, 1991.

BACKGROUND OF THE INVENTION

1. Field of the Invention

The present invention relates to a superconducting device and a method for manufacturing the same, and more specifically to a superconducting device including an extremely thin superconducting channel formed of oxide superconductor material, and a method for manufacturing the same.

2. Description of Related Art

Typical three-terminal devices which utilize a superconductor include a so called superconducting-base transistor and a so called super-FET (field effect transistor). The superconducting-base transistor includes an emitter of a superconductor or a normal conductor, a tunnel barrier of an insulator, a base of a superconductor, a semiconductor isolator and a collector of a normal conductor, stacked in the named order. This superconducting-base transistor operates at a high speed with a low power consumption, by utilizing high speed electrons passing through the tunnel barrier.

The super-FET includes a semiconductor layer, and a superconductor source electrode and a superconductor drain electrode which are formed closely to each other on the semiconductor layer. A portion of the semiconductor layer between the superconductor source electrode and the superconductor drain electrode has a greatly recessed or undercut rear surface so as to have a reduced thickness. In addition, a gate electrode is formed through a gate insulating layer on the recessed or undercut rear surface of the portion of the semiconductor layer between the superconductor source electrode and the superconductor drain electrode.

A superconducting current flows through the semiconductor layer portion between the superconductor source electrode and the superconductor drain electrode due to a superconducting proximity effect, and is controlled by an applied gate voltage. This super-FET also operates at a high speed with a low power consumption.

In addition, in the prior art, there has been proposed a three-terminal superconducting device having a channel of a superconductor formed between a source electrode and a drain electrode, so that a current flowing through the superconducting channel is controlled by a voltage applied to a gate formed above the superconducting channel.

Both of the above mentioned superconducting-base transistor and the super-FET have a portion in which a semiconductor layer and a superconducting layer are stacked to each other. However, it is difficult to form a stacked structure of the semiconductor layer and the superconducting layer formed of an oxide superconductor which has been recently advanced in study. In addition, even if it is possible to form a stacked structure of the semiconductor layer and the oxide superconducting layer, it is difficult to control a boundary between the semiconductor layer and the oxide superconducting layer. Therefore, a satisfactory operation could not been obtained in these superconducting devices.

In addition, since the super-FET utilizes the superconducting proximity effect, the superconductor source electrode and the superconductor drain electrode have to be located close to each other at a distance which is not greater than a few times the coherence length of the superconductor materials of the superconductor source electrode and the superconductor drain electrode. In particular, since an oxide superconductor has a short coherence length, if the superconductor source electrode and the superconductor drain electrode are formed of the oxide superconductor material, a distance between the superconductor source electrode and the superconductor drain electrode has to be not greater than a few ten nanometers. However, it is very difficult to conduct a fine processing such as a fine pattern etching so as to ensure the very short separation distance. Because of this, in the prior art, it has been impossible to manufacture the super-FET composed of the oxide superconductor material.

Furthermore, it has been confirmed that the conventional three-terminal superconducting device having the superconducting channel shows a modulation operation. However, the conventional three-terminal superconducting device having the superconducting channel could not realize a complete ON/OFF operation, because a carrier density is too high. In this connection, since an oxide superconductor material has a low carrier density, it is expected to form a three-terminal superconducting device which has a superconducting channel and which can realize the complete ON/OFF operation, by forming the superconducting channel of the oxide superconductor material. In this case, however, a thickness of the superconducting channel has to be made on the order of five nanometers.

SUMMARY OF THE INVENTION

Accordingly, it is an object of the present invention to provide a superconducting device and a method for manufacturing the same, which have overcome the above mentioned defects of the conventional ones.

Another object of the present invention is to provide a superconducting device including a superconducting region constituted of an extremely thin oxide superconductor film, which can be manufactured by using existing established processing techniques with a good repeatability.

Still another object of the present invention is to provide an FET type superconducting device including a superconducting channel composed of an extremely thin oxide superconductor film, and a method for manufacturing the same with a good repeatability by using existing established processing techniques.

The above and other objects of the present invention are achieved in accordance with the present invention by a superconducting device comprising a substrate, a superconducting channel constituted of an oxide superconductor thin film formed on the substrate, a superconductor source electrode and a superconductor drain electrode formed at opposite ends of the superconducting channel, so that a superconducting current can flow through the superconducting channel between the source electrode and the drain electrode, and a gate electrode located through an insulating layer on the superconducting channel so as to control the superconducting current flowing through the superconducting channel, the oxide superconductor thin film of the superconducting channel being formed of a c-axis oriented oxide superconductor crystal, and the oxide superconductor thin film of the superconductor source electrode and the superconductor drain electrode being formed of an a-axis oriented oxide superconductor crystal, the superconducting channel being continuous to the superconductor source electrode and the superconductor drain electrode.

Here, the source electrode should be understood to include not only an electrode corresponding to the electrode which is called a "source electrode" in the field of a semiconductor MOSFET, but also a source region which is formed adjacent to and continuous to the superconducting channel and on which the source electrode is formed, and the drain electrode should be understood to include not only an electrode corresponding to the electrode which is called a "drain electrode" in the field of the semiconductor MOSFET, but also a drain region which is formed adjacent to and continuous to the superconducting channel and on which the drain electrode is formed.

As seen from the above, the superconducting device in accordance with the present invention is characterized in that the oxide superconductor thin film of the superconducting channel is formed of a c-axis oriented oxide superconductor crystal, and the oxide superconductor thin film of the superconductor source electrode and the superconductor drain electrode is formed of an a-axis oriented oxide superconductor crystal.

Therefore, the superconducting device in accordance with the present invention is constructed so that a main current flows through the superconducting channel and is controlled by the gate voltage. Therefore, differently from the conventional super-FET in which a superconducting current flows through the semiconductor channel due to the superconducting proximity effect, the limitation in the fine processing techniques required for manufacturing the super-FET can be relaxed.

In general, the oxide superconductor has large crystalline inhomogeneity. In particular, the critical current density is larger in directions perpendicular to the c-axis, than in a direction parallel to the c-axis. Therefore, if a superconductor source electrode and a superconductor drain electrode have been formed of c-axis oriented oxide superconductor thin films, it has been difficult to cause a superconducting current to uniformly flow through an extremely thin superconducting channel of an oxide superconductor. As mentioned above, in the superconducting device in accordance with the present invention, since the superconductor source electrode and the superconductor drain electrode are formed of an a-axis oriented oxide superconductor thin film, the main current is allowed to flow within the superconductor source electrode and the superconductor drain electrode in a direction perpendicular to the substrate. On the other hand, since the superconducting channel is formed of a c-axis oriented oxide superconductor thin film, the main current is allowed to flow within the superconducting channel in a direction parallel to the substrate. Therefore, in each of the superconductor source electrode, the superconductor drain electrode and the superconducting channel, the main current is caused to flow in a direction having a large critical current density of the oxide superconductor crystal.

The c-axis oriented oxide superconductor thin film superconducting channel can be easily formed by maintaining the substrate at a temperature of about 700° C. when the oxide superconductor thin film is deposited.

On the other hand, the a-axis oriented oxide superconductor thin film superconductor source electrode and superconductor drain electrode can be easily formed by maintaining the substrate at a temperature of not greater than about 650° C. when the oxide superconductor thin film is deposited. In any case, the oxide superconductor thin film can be deposited by a sputtering such as an off-axis sputtering, a reactive evaporation, an MBE (molecular beam epitaxy), a vacuum evaporation, a CVD (chemical vapor deposition), etc.

In a preferred embodiment, the oxide superconductor thin film is formed of a material selected from the group consisting of a Y—Ba—Cu—O type compound oxide superconductor material, a Bi—Sr—Ca—Cu—O type compound oxide superconductor material, and a Tl—Ba—Ca—Cu—O type compound oxide superconductor material.

In addition, the substrate, on which the oxide superconductor thin film is deposited, can be formed of an insulating substrate, preferably an oxide single crystalline substrate such as MgO, $SrTiO_3$, and $CdNdAlO_4$. These substrate materials are very effective in forming or growing a crystalline film having a high orientation property. However, the superconducting device can be formed on a semiconductor substrate if an appropriate buffer layer is deposited thereon. For example, the buffer layer on the semiconductor substrate can be formed of a double-layer coating formed of a $MgAl_2O_4$ layer and a $BaTiO_3$ layer if a silicon substrate is used.

In order to ensure that the superconducting channel can be turned on and off by a voltage applied to the gate electrode, a thickness of the superconducting channel has to be not greater than five nanometers in the direction of an electric field created by the voltage applied to the gate electrode.

According to one aspect of the method in accordance with the present invention for manufacturing the superconducting device in accordance with the present invention, the superconducting channel is formed of an extremely thin portion of the c-axis oriented oxide superconductor film formed on a projecting insulating region formed on a principal surface of the substrate.

In this connection, if the oxide superconductor thin film is simply deposited on the substrate having the projecting insulating region, the thickness of an oxide superconductor thin film portion on the projecting insulating region is the same as that of the other portion of the deposited oxide superconductor thin film. Therefore, a surface of the oxide superconductor thin film deposited on a whole surface of the substrate is planarized so that the extremely thin portion of the c-axis oriented oxide superconductor thin film is left or formed on only the projecting insulating region.

According to another aspect of the method in accordance with the present invention for manufacturing the superconducting device in accordance with the present invention, a superconductor source electrode and a superconductor drain electrode of an a-axis oriented oxide superconductor thin film are previously formed on a planar principal surface of a substrate separately from each other, and thereafter, an extremely thin c-axis oriented oxide superconductor thin film is deposited on the substrate between the superconductor source electrode and the superconductor drain electrode so that a superconducting channel is formed between the superconductor source electrode and the superconductor drain electrode. The extremely thin c-axis oriented oxide superconductor thin film has a thickness on the order of for example five nanometers. This extremely thin oxide superconductor film can be formed in a conventional process by precisely controlling the growth speed and the growth time of the thin film. For this purpose, a sputtering can be preferably used. However, since the oxide superconductor crystal has a multi-layer structure in which respective constituent elements are stacked in a layered structure, it is possible to stack a desired number of unit cells of oxide superconductor, by using a MBE (molecular beam epitaxy). In addition, as mentioned above, the extremely thin oxide superconductor film can be formed by maintaining the substrate temperature at about 700° C. when the oxide superconductor thin film is deposited.

Thereafter, a gate electrode is formed through a gate insulator on a portion of the c-axis oriented oxide superconductor thin film between the superconductor source electrode and the superconductor drain electrode, and if necessary, a source electrode and a drain electrode of a normal conductor material may be formed on the superconductor source electrode and the superconductor drain electrode, respectively.

Specifically, the superconductor source electrode and the superconductor drain electrode are formed as follows: First, a crystal disturbing layer is deposited on a selected position of the principal surface of the substrate corresponding to a position where an oxide superconductor thin film for the superconducting channel is to be formed in the future. For example, this crystal disturbing layer is formed of $SiO_2$ and has a thickness of about 200 to 300 nanometers.

Then, an a-axis oriented oxide superconductor thin film is uniformly deposited on the principal surface of the substrate so as to cover the crystal disturbing layer. This a-axis oriented oxide superconductor thin film has a thickness substantially equal to that of a crystal disturbing layer, and can be formed by preferably the off-axis sputtering maintaining the substrate temperature at about 650° C. or less. In the process of the deposition, a portion of the a-axis oriented oxide superconductor thin film deposited on the crystal disturbing layer becomes non-superconductive, because crystallizability is disturbed. Then, the non-superconductor oxide thin film deposited on the crystal disturbing layer and the crystal disturbing layer itself are selectively removed, so that the superconductor source electrode and the superconductor drain electrode are formed separately from each other.

In the above mentioned process, no fine-processing such as a fine-etching or a fine-patterning is required. Therefore, the limitation in the fine processing technique required for manufacturing the super-FET is relaxed.

The above and other objects, features and advantages of the present invention will be apparent from the following description of preferred embodiments of the invention with reference to the accompanying drawings.

DESCRIPTION OF THE PREFERRED EMBODIMENTS

Embodiment 1

Referring to FIGS. 1A to 1H and 1J, a first embodiment of the process in accordance with the present invention for manufacturing the super-FET will be described.

Figure 1A:
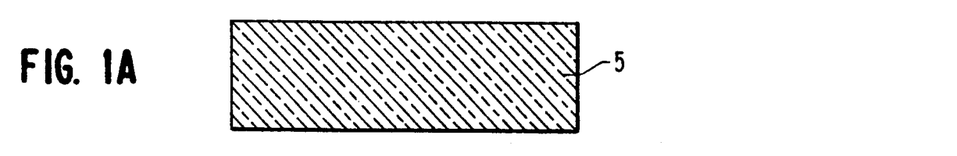
FIGS. 1A to 1H and 1J are diagrammatic sectional views for illustrating a first embodiment of the process in accordance with the present invention for manufacturing the super-FET.

First, a substrate 5 is prepared as shown in FIG. 1A. This substrate 5 is formed of for example, an insulating substrate such as a MgO (100) substrate, a $SrTiO_3$ (100) substrate or others, or a semiconductor substrate such as a silicon (100) substrate having a principal surface coated with insulating films. However, if the semiconductor substrate is used, after a projection mentioned hereinafter is formed on the principal surface, the insulating films are formed on the principal surface.

Figure 1B:
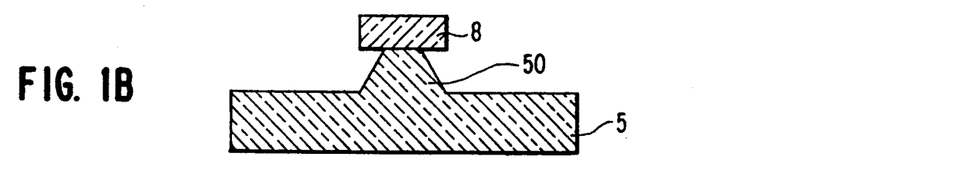

As shown in FIG. 1B, a photoresist mask 8 is formed on a portion of the principal surface of the substrate 5 corresponding to a projection forming position, and the principal surface of the substrate 5 is selectively etched or recessed by a dry etching process such as an Ar ion etching, so that a projection 50 is formed on the principal surface of the substrate 5. Thereafter, the photoresist mask 8 is removed.

In the case that a semiconductor substrate is used, a crystalline direction is important, and therefore, the process is modified. For example, if a silicon substrate is used, a photoresist mask 8 is formed so as to ensure that a gate length direction (a channel current direction) is in parallel to a Si(100) plane and perpendicular to a Si(110) plane. The silicon substrate partially masked with the photoresist 8 is etched with an etching liquid such as KOH or APW, so that a projection 50 is formed. Thereafter the photoresist mask 8 is removed, and the principal surface having the projection 50 is continuously coated with $MgAl_2O_4$ by a CVD process and with $BaTiO_3$ by a sputtering process.

Figure 1C:
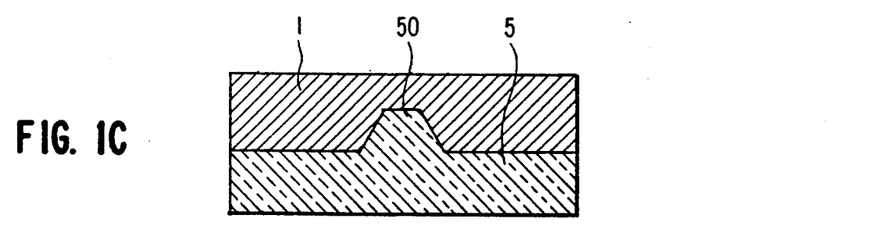

Then, as shown in FIG. 1C, a c-axis orientated oxide superconductor thin film 1 is deposited on the principal surface of the substrate 5, by for example an off-axis sputtering, a reactive evaporation, an MBE (molecular beam epitaxy), a CVD, etc. The oxide superconductor material is preferably formed of, for example, a Y—Ba—Cu—O type compound oxide superconductor material, a Bi—Sr—Ca—Cu—O type compound oxide superconductor material, and a Tl—Ba—Ca—Cu—O type compound oxide superconductor material.

In the case of forming tile c-axis orientated thin film of $Y_1Ba_2Cu_3O_{7-x}$, the off-axis sputtering is performed under the condition that a sputtering gas is composed of Ar and $O_2$ at the ratio of Ar:$O_2$=90%:10%, the sputtering gas pressure is 10 Pa, and the substrate temperature is 700° C.

The oxide superconductor thin film 1 has a thickness of not greater than five nanometers in a portion on the projection 50. For realizing the thickness of not greater than five nanometers, since the oxide superconductor thin film 1 as deposited has a uniform thickness anywhere, it is necessary to firstly deposit a photoresist layer (not shown) on the oxide superconductor thin film 1 in such a manner that the deposited photoresist layer has a plat upper surface, and then, to etch back and planarize the deposited photoresist layer and an upper surface of the deposited oxide superconductor thin film so as to form an extremely thin oxide superconductor film portion on the projection 50.

Figure 1D:
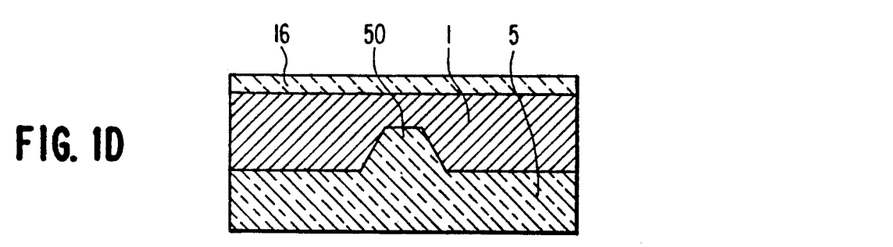

Then, as shown in FIG. 1D, an insulating layer 16 is deposited on the oxide superconductor thin film 1. The insulating layer 16 has a thickness sufficient to prevent a tunnel current, for example, a thickness of not less than 10 nanometers. In addition, the insulating layer 16 is preferably formed of an insulating material such as MgO, which does not form a large density of energy levels between the superconductor thin film 1 and the insulating layer 16.

Figure 1E:
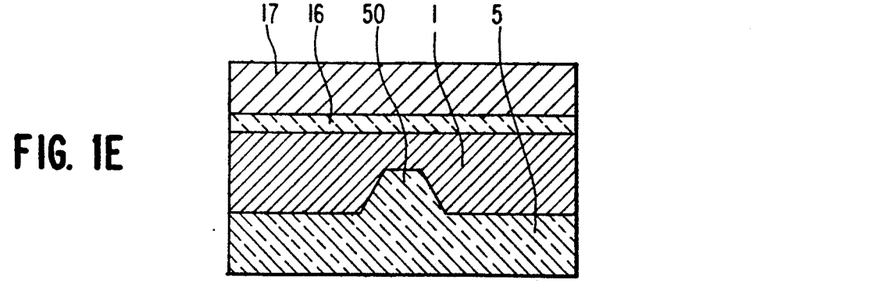

Furthermore, as shown in FIG. 1E, a normal conductor layer 17 for a gate electrode is deposited on the insulating layer 16. The normal conductor layer 17 is preferably formed of a refractory metal such as Ti, W, etc., or Au, or a silicide thereof. It is preferred that the insulating layer 16 and the normal conductor layer 17 are continuously deposited on the superconductor thin film 1 without being taken out of a deposition chamber, in order to reduce the density of energy levels at a boundary, to prevent contamination, and to reduce a mechanical stress.

Figure 1F:
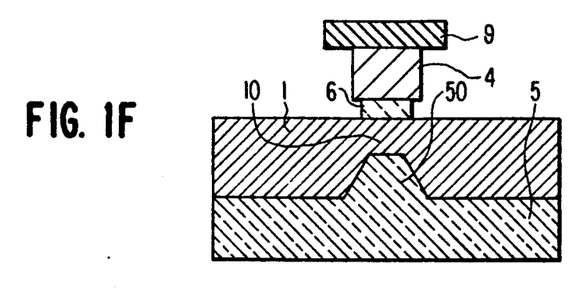

Then, a refractory mask 9 for a gate electrode patterning is formed on the normal conductor layer 17 at a position where a gate electrode is to be formed in future and which is therefore positioned above the projection 50. The insulating layer 16 and the normal conductor layer 17 which are not covered by the refractory mask 9 are etched by the reactive ion etching or the Ar-ion milling so as to form an gate electrode 4 and a gate insulator 6, as shown in FIG. 1F. The refractory mask 9 is formed of a refractory metal such as Mo, and can be deposited by a vacuum evaporation process. If necessary, the gate insulator 6 is side-etched in comparison with the gate electrode 4 so that the length of the gate insulator 6 is shorter than that of the gate electrode 4. A portion of the oxide superconductor thin film 1 above the projection 50 and underneath the gate electrode 4 forms a superconducting channel 10.

Figure 1G:
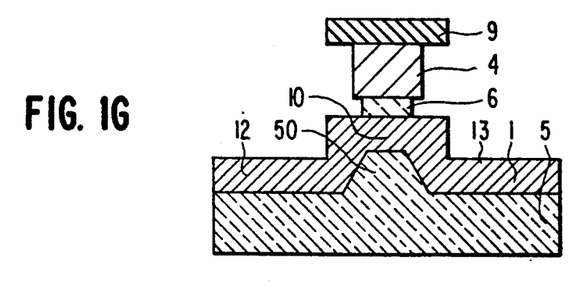

After formation of the gate electrode 4 and the gate insulator 6, portions 12 and 13 of the oxide superconductor thin film 1 at both sides of the superconducting channel 10 are etched or recessed so that an upper surface of the portions 12 and 13 becomes lower than that of the superconducting channel 10 by a depth of not less than ten nanometers, as shown in FIG. 1G.

Figure 1H:
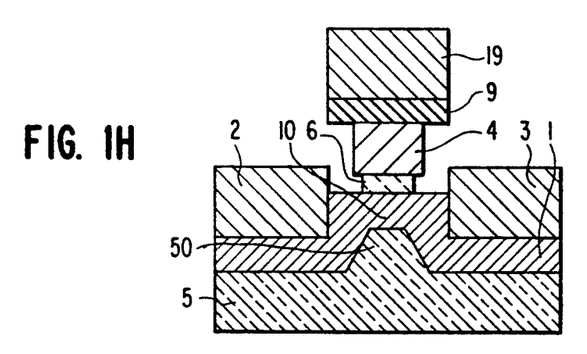

As shown in FIG. 1H, an a-axis oriented thin film of the same oxide superconductor as that of the oxide superconductor thin film 1 is deposited so as to form a source electrode 2 and a drain electrode 3 on the recessed portions 12 and 13 of the oxide superconductor thin film 1, respectively. The source electrode 2 and the drain electrode 3 have a thickness of about 200 nanometers, and can be formed by any deposition process such as an off-axis sputtering, a reactive evaporation, an MBE, a CVD, etc. In the case of forming the a-axis orientated thin film of $Y_1Ba_2Cu_3O_{7-x}$ by the off-axis sputtering, the sputtering condition is that a sputtering gas is composed of Ar and $O_2$ at the ratio of Ar:$O_2$=90%:10%, the sputtering gas pressure is 10 Pa, and the substrate temperature is 640° C.

Figure 1J:
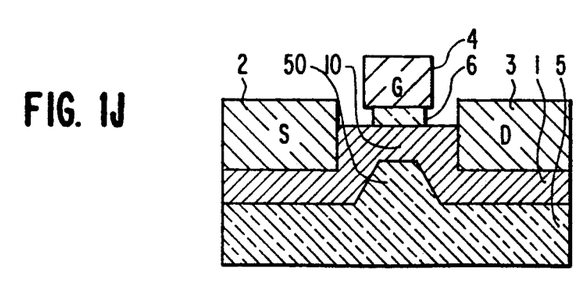

In this process, it is considered that a film 19 of the a-axis orientated oxide superconductor thin film is deposited on the refractory mask 9 as shown in FIG. 1H. In fact, however, if the refractory mask 9 is formed of Mo, an oxide superconductor thin film deposited on the refractory mask 9 is sublimed in the process of the deposition of the a-axis oriented oxide superconductor electrodes 2 and 3. Thereafter, the refractory mask 9 is removed. Thus, the superconducting device is completed as shown in FIG. 1J. The mask 9 can be also formed of an insulating film in place of the refractory metal. In this case, the mask 9 can be left on the gate electrode, since it does not give any influence on the gate characteristics.

Thus, the super-FET shown in FIG. 1J includes the oxide superconductor thin film 1 formed on the principal surface of the substrate 5 having the projection 50. The oxide superconductor thin film 1 is formed of the c-axis oriented oxide superconductor thin film and has a substantially planarized upper surface. The portion of the oxide superconducting thin film 1 on the projection 50 is thinner than the other portion of the oxide superconducting thin film 1, and forms a superconducting channel 10 of not greater than five nanometers. At both sides of the superconducting channel 10, the oxide superconductor thin film 1 is recessed by the depth of about ten nanometers, and the source electrode 2 and the drain electrode 3 formed of the a-axis oriented oxide superconducting thin film are located at the two recessed portions of the oxide superconducting thin film 1, respectively. In addition, the gate electrode 4 is located on the superconducting channel 10 through the gate insulator 6.

As explained above, if the above mentioned super-FET is manufactured in accordance with the above mentioned process, since a superconducting current can be flowed uniformly through the superconducting channel, the performance of the super-FET can be increased. Furthermore, the limitation in the fine processing technique required for manufacturing the super-FET is relaxed. In addition, since the substantially planarized upper surface is obtained, it become easy to form conductor wirings in a later process. Accordingly, it is easy to manufacture the super-FET with good repeatability, and the manufactured super-FET has a stable performance.

Embodiment 2

Referring to FIGS. 2A to 2H, a second embodiment of the process in accordance with the present invention for manufacturing the superconducting device will be described.

Figure 2A:
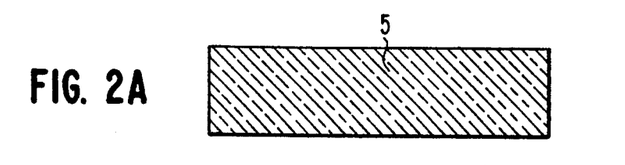
FIGS. 2A to 2H are diagrammatic sectional views for illustrating a second embodiment of the process in accordance with the present invention for manufacturing the super-FET.

First, the substrate 5 is prepared as shown in FIG. 2A. Similarly to the Embodiment 1, this substrate 5 is formed of for example, an insulating substrate such as a MgO (100) substrate, a $SrTiO_3$ (100) substrate or others, or a semiconductor substrate such as a silicon (100) substrate having a principal surface coated with insulating films. However, if the silicon substrate is used, the principal surface of the substrate is continuously coated with $MgAl_2O_4$ by the CVD process and with $BaTiO_3$ by the sputtering process.

Figure 2B:
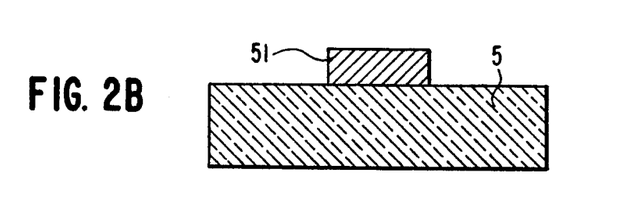

As shown in FIG. 2B, a $SiO_2$ layer 15 having a thickness of not less than 200 nanometers is formed on a central portion of the principal surface of the substrate 5 corresponding to a superconducting channel forming position.

Figure 2C:
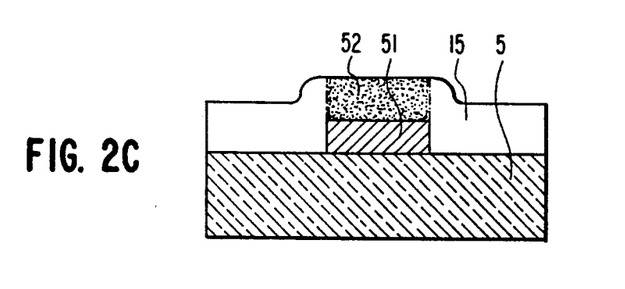

Then, as shown in FIG. 2C, an a-axis orientated oxide superconductor thin film 15 also having a thickness of not less than 200 nanometers is deposited on the principal surface of the substrate 5, by for example an off-axis sputtering.

Similarly to the Embodiment 1, the oxide superconductor material is preferably formed of, for example, a Y—Ba—Cu—O type compound oxide superconductor material, a Bi—Sr—Ca—Cu—O type compound oxide superconductor material, and a Tl—Ba—Ca—Cu—O type compound oxide superconductor material.

In the case of forming the a-axis orientated thin film of $Y_1Ba_2Cu_3O_{7-x}$ by the off-axis sputtering, the sputtering condition is that a sputtering gas is composed of Ar and $O_2$ at the ratio of Ar:$O_2$=90%:10%, the sputtering gas pressure is 10 Pa, an is 640° C.

A portion 52 of the a-axis orientated oxide superconductor thin film 15 deposited on the $SiO_2$ layer 51 becomes a non-superconductor layer because crystallizability in the portion 52 deposited on the $SiO_2$ layer 51 is disturbed or destroyed.

Figure 2D:
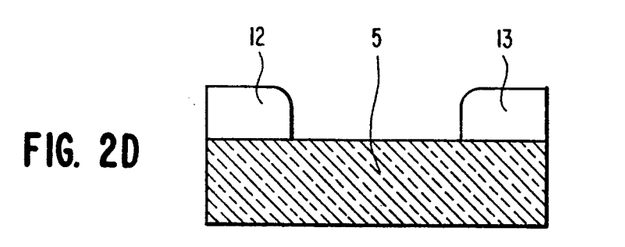

Thereafter, the non-superconductor layer 52 and the $SiO_2$ layer 51 are removed by a dry etching process such as the Ar-ion etching, as shown in FIG. 2D, so that a superconductor source region (electrode) 12 and a superconductor drain region (electrode) 13 formed of the a-axis oriented oxide superconductor thin film are left or formed because of the etching speed difference due to difference in crystallizability between the a-axis orientated oxide superconductor thin film 15 and the non-superconductor layer 52.

Figure 2E:
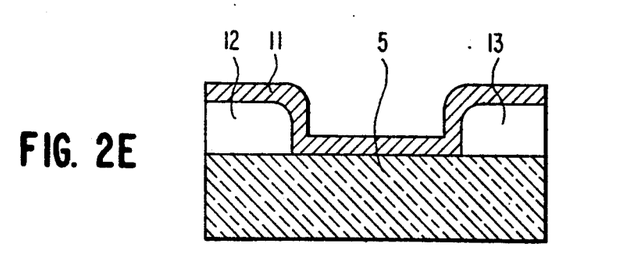

Then, as shown in FIG. 2E, a c-axis oriented oxide superconductor thin film 11, which has a thickness of not greater than five nanometers and which is formed of the same superconductor material as that of the a-axis oriented oxide superconductor thin film 15, is deposited on the principal surface of the substrate 5, the superconductor source region 12 and the superconductor drain region 13, by for example an off-axis sputtering, a reactive evaporation, the MBE, the CVD, etc. In the case of forming the c-axis orientated thin film 11 of $Y_1Ba_2Cu_3O_{7-x}$ by the off-axis sputtering, the sputtering condition is that a sputtering gas is composed of Ar and $O_2$ at the ratio of Ar:$O_2$=90%:10%, the sputtering gas pressure is 10 Pa, and the substrate temperature is 700° C.

Figure 2F:
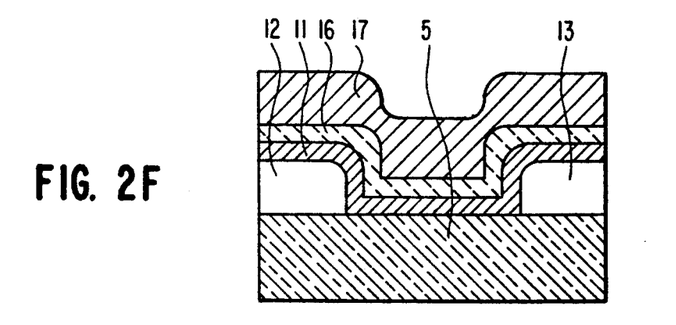

Then, as shown in FIG. 2F, an insulating layer 16 is deposited on the oxide superconductor thin film 11, and a normal conductor layer 17 for a gate electrode is deposited on the insulating layer 16. The insulating layer 16 has a thickness sufficient to prevent a tunnel current, for example, a thickness of not less than 10 nanometers. In addition, the insulating layer 16 is preferably formed of an insulating material such as $Si_3N_4$ or MgO, which does not form a large density of energy levels between the superconductor thin film 11 and the insulating layer 16. The normal conductor layer 17 is deposited by any deposition process, for example, the vacuum evaporation, to have a thickness of about 200 nanometer. The normal conductor layer 17 is preferably formed of a refractory metal such as Ti, W, etc., or Au, or a silicide thereof. It is preferred that the insulating layer 16 and the normal conductor layer 17 are continuously deposited on the superconductor thin film 11 without being taken out of a deposition chamber, in order to reduce a mechanical stress.

Figure 2G:
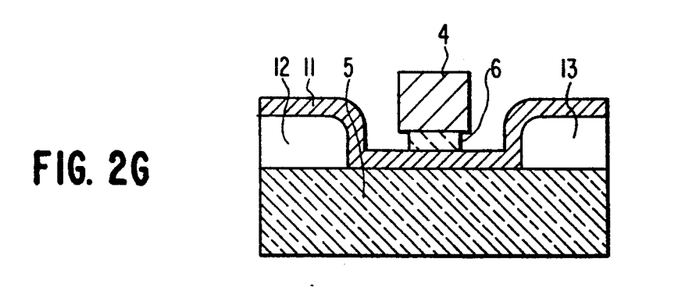

Then, the insulating layer 16 and the normal conductor layer 17 are selectively etched by the reactive ion etching and the Ar-ion milling so as to form an gate electrode 4 and a gate insulator 6, as shown in FIG. 2G. In this process, the gate insulator 6 is side-etched in comparison with the gate electrode 4 so that the length of the gate insulator 6 is shorter than that of the gate electrode 4.

After formation of the gate electrode 4 and the gate insulator 6, the c-axis oriented oxide superconducting thin film 11 on the superconducting source region 12 and the superconductor drain region 13 are removed, and then, a source electrode 2 and a drain electrode 3 formed of the same material as that of the gate electrode 4 are deposited on the superconducting source region 12 and the superconducting drain region 13, respectively, as shown in FIG. 2G.

Figure 2H:
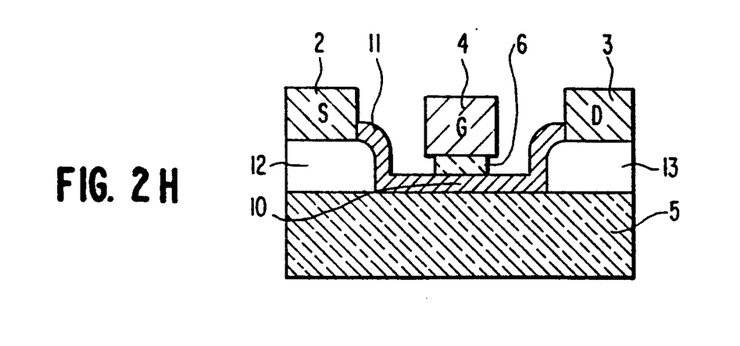

Thus, the super-FET shown in FIG. 2H includes the extremely thin c-axis oriented oxide superconductor film 11 formed on the principal surface of the substrate 5, and the superconducting source region 12 and the superconducting drain region 13 formed of the a-axis oriented oxide superconductor thin film. The superconducting channel 10 is formed of the extremely thin c-axis oriented oxide superconductor film having the thickness of about five nanometers. On the other hand, the superconductor source region 12 and the superconductor drain region 13 are formed of the a-axis oriented oxide superconductor thin film having the thickness of about 200 nanometers.

In addition, the gate electrode 4 is located on the superconducting channel 10 through the gate insulator 6. The source electrode 2 and the drain electrode 3 are formed on the superconductor source region 12 and the superconductor drain region 13.

As explained above, in the super-FET in accordance with the present invention, a main current flows through the superconducting channel and is controlled by the gate voltage. Therefore, differently from the conventional super-FET in which a superconducting current flows through the semiconductor channel due to the superconducting proximity effect, the limitation in the fine processing techniques required for manufacturing the super-FET can be relaxed. In addition, since it is not necessary to stack the superconductor and the semiconductor, a high performance superconducting device can be realized by using an oxide superconductor. Therefore, the application of the superconduction technology to the electronic devices can be promoted.

The invention has thus been shown and described with reference to the specific embodiments. However, it should be noted that the present invention is in no way limited to the details of the illustrated structures but changes and modifications may be made within the scope of the appended claims.

We claim:

1. A method of manufacturing a superconducting device, comprising the step of preparing a substrate having a projecting insulating region formed on a principal surface thereof, forming a c-axis oriented oxide superconductor thin film on the principal surface of the substrate including the projection so that a thickness of the oxide superconductor thin film on said projecting insulating region is thinner than that of the oxide superconductor thin film on the substrate other than said projecting insulating region, providing a gate electrode through a gate insulator on a portion of said c-axis oriented oxide superconductor thin film on said projecting insulating region, shallowly recessing said c-axis oriented oxide superconductor thin film at both sides of said projecting insulating region, and forming a superconductor source electrode and a superconductor drain electrode of an a-axis oriented oxide superconductor thin film on the shallowly recessed portions of said c-axis oriented oxide superconductor thin film at both sides of said projecting insulating region.

2. A method claimed in claim 1 wherein said c-axis oriented oxide superconductor thin film is formed so that the thickness of the oxide superconductor thin film on said projecting insulating region is not greater than five nanometers, and said shallowly recessed portions of said c-axis oriented oxide superconductor thin film is formed by etching said c-axis oriented oxide superconductor thin film at both sides of said projecting insulating region by a depth of not less than ten nanometers.

3. A method claimed in claim 1 wherein said shallowly recessed portions of said c-axis oriented oxide superconductor thin film is formed by forming a refractory metal mask on said gate electrode and etching said c-axis oriented oxide superconductor thin film by using said refractory metal mask as a mask, and said superconductor source electrode and superconductor drain electrode of the a-axis oriented oxide superconductor thin film are formed on the shallowly recessed portions of said c-axis oriented oxide superconductor thin film at both sides of said projecting insulating region by depositing an a-axis oriented oxide superconductor thin film by using said refractory metal mask as a mask.

4. A method of manufacturing a superconducting device, comprising the step of preparing a substrate having a planar principal surface thereof, forming a superconductor source electrode and a superconductor drain electrode of an a-axis oriented oxide superconductor thin film on said planar principal surface of said substrate separately from each other, forming on said principal surface of said substrate a c-axis oriented oxide superconductor thin film which is thinner than said a-axis oriented oxide superconductor thin film, so that a superconducting channel is formed between said superconductor source electrode and said superconductor drain electrode, providing a gate electrode through a gate insulator on said c-axis oriented oxide superconductor thin film between said superconductor source electrode and said superconductor drain electrode, removing a portion of said c-axis oriented oxide superconductor thin film on each of said superconductor source electrode and said superconductor drain electrode, and forming a source electrode and a drain electrode of a normal conductor material on an exposed portion of said superconductor source electrode and said superconductor drain electrode, respectively.

5. A method claimed in claim 4 wherein said superconductor source electrode and said superconductor drain electrode are formed by depositing a crystal disturbing layer on a selected position of said principal surface of said substrate, uniformly depositing an a-axis oriented oxide superconductor thin film on said principal surface of said substrate so as to cover said crystal disturbing layer so that a portion of the a-axis oriented oxide superconductor thin film deposited on said crystal disturbing layer becomes non-superconductive, and selectively removing a non-superconductive portion of said a-axis oriented oxide superconductor thin film deposited on said crystal disturbing layer and said crystal disturbing layer, so that two portions of the a-axis oriented oxide superconductor thin film are formed separately from each other so as to form said superconductor source electrode and said superconductor drain electrode.

6. A method claimed in claim 5 wherein said crystal disturbing layer is formed by $SiO_2$.

7. A method claimed in claim 6 wherein said non-superconductive portion of said a-axis oriented oxide superconductor thin film deposited on said $SiO_2$ layer and said $SiO_2$ layer are selectively removed by a dry etching process utilizing the etching speed difference due to difference in crystallizability between said a-axis orientated oxide superconductor thin film and said non-superconducting portion.

* * * * *